(12) United States Patent
Kimura et al.

(10) Patent No.: US 10,090,178 B2
(45) Date of Patent: Oct. 2, 2018

(54) GAS TEMPERATURE MEASUREMENT METHOD AND GAS INTRODUCTION SYSTEM

(71) Applicant: TOKYO ELECTRON LIMITED, Tokyo (JP)

(72) Inventors: Hidetoshi Kimura, Miyagi (JP); Yutaka Matsui, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 134 days.

(21) Appl. No.: 15/360,045

(22) Filed: Nov. 23, 2016

(65) Prior Publication Data

US 2017/0148653 A1    May 25, 2017

(30) Foreign Application Priority Data

Nov. 25, 2015    (JP) .................. 2015-229665

(51) Int. Cl.
| | |
|---|---|
| G01K 11/00 | (2006.01) |
| H01L 21/67 | (2006.01) |
| G01L 19/00 | (2006.01) |
| B01F 13/02 | (2006.01) |

(52) U.S. Cl.
CPC ........ H01L 21/67248 (2013.01); G01K 11/00 (2013.01); G01L 19/0007 (2013.01); B01F 13/0266 (2013.01)

(58) Field of Classification Search
CPC ............. H01L 21/67248; G01K 11/00; G01L 19/0007; B01F 13/0266

USPC .......................................... 702/130
See application file for complete search history.

(56) References Cited

U.S. PATENT DOCUMENTS

| | | | |
|---|---|---|---|
| 2006/0076060 A1* | 4/2006 | Ohmi .................. | G05D 7/0635 137/334 |
| 2013/0186471 A1 | 7/2013 | Nagase et al. | |
| 2014/0013838 A1* | 1/2014 | Sawada ..................... | G01F 1/34 73/203 |
| 2014/0332114 A1* | 11/2014 | Nagura ................. | F17C 13/025 141/4 |

FOREIGN PATENT DOCUMENTS

| | | |
|---|---|---|
| JP | 2006-337346 A | 12/2006 |
| JP | 2012-32983 A | 2/2012 |

* cited by examiner

*Primary Examiner* — Sujoy Kundu
*Assistant Examiner* — Lynda Dinh
(74) *Attorney, Agent, or Firm* — Rothwell, Figg, Ernst & Manbeck, P.C.

(57) ABSTRACT

There is provided a method of measuring a temperature of a gas in a line connected to a gas supply source and a decompressor, the line being divided by a first, a second and a third valve into a first line between the first valve and the second valve and a second line between the second valve and the third valve. A first pressure rise rate of a gas in the first line is measured when introducing a gas at a predetermined flow rate into the first and the second line. A second pressure rise rate of a gas in the first line is measured when introducing a gas at a predetermined flow rate only into the first line. A gas temperature in the first line is calculated based on known inner volume of the second line, the first pressure rise rate, and the second pressure rise rate.

6 Claims, 3 Drawing Sheets

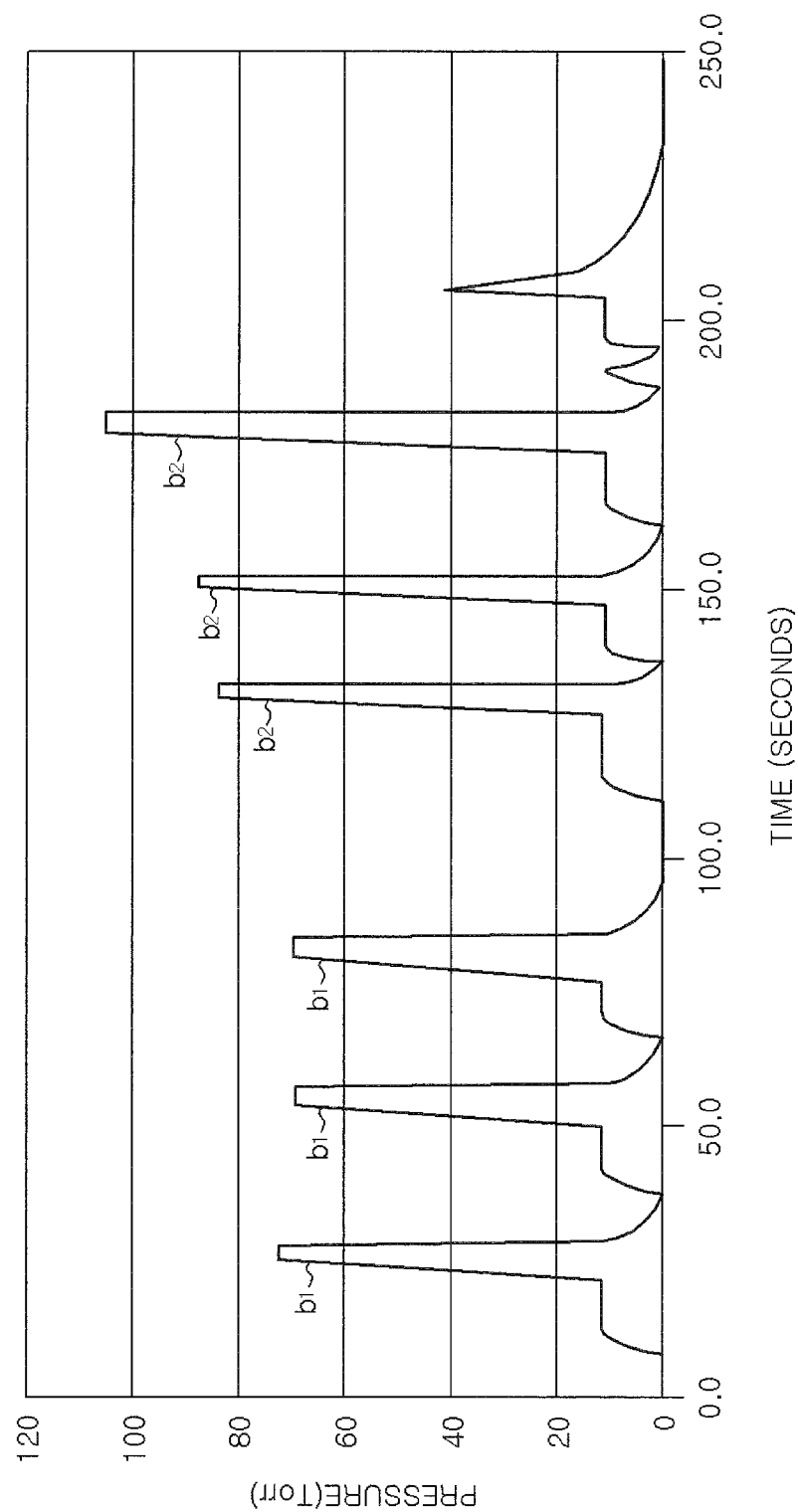

GAS TEMPERATURE MEASUREMENT METHOD AND GAS INTRODUCTION SYSTEM

CROSS-REFERENCE TO RELATED APPLICATIONS

This application claims priority to Japanese Patent Application No. 2015-229665 filed on Nov. 25, 2015, the entire contents of which are incorporated herein by reference.

FIELD OF THE INVENTION

The disclosure relates to a gas temperature measurement method and a gas introduction system.

BACKGROUND OF THE INVENTION

In a semiconductor device manufacturing process, a plasma of a processing gas is often used and, thus, parameters related to plasma generation are important. The parameters related to the plasma generation include, e.g., a degree of depressurization in a processing chamber, a frequency of a high frequency power, and a flow rate of a processing gas. The flow rate of the processing gas is controlled by a gas flow rate controller such as a FCS (Flow Control System) (Registered Trademark), a MFC (Mass Flow Controller) or the like. However, a set value of a flow rate in the gas flow rate controller may not be equal to an actually controlled flow rate due to a manufacturing error, temporal deterioration or the like. Accordingly, the gas flow rate controller is calibrated upon shipping or regular maintenance.

As for a method for calibrating a gas flow rate controller, there is known a method of comparing a set flow rate and an actual flow rate calculated from a gas pressure and a gas temperature of a build-up tank, which has a known inner volume and is connected in series to a gas flow rate controller, by allowing a set flow rate of gas to flow into the buildup tank (see, e.g., Japanese Patent Application Publication No. 2012-32983). In addition, there is also known a method of, by measuring gas temperatures and gas pressures at different timings in case of allowing a gas to flow into a line which is provided at a downstream side of a gas flow rate controller and has a known inner volume and obtaining masses of gases introduced at the respective timings from the measured gas temperatures and gas pressures, checking an absolute flow rate of the gas flow rate controller from a difference between the masses of gases (see, e.g., Japanese Patent Application Publication No. 2006-337346).

Further, as for a method for calculating a volume of a processing chamber, there is known a method of estimating a volume of a processing chamber based on variation of gas pressures in a line and in the processing chamber by introducing a gas at a predetermined flow rate into the line having a known inner volume and then into the processing chamber.

In the method described above such as the method of calibrating a gas flow rate controller or the method of calculating a volume of a processing chamber, it is considered that a gas temperature is equal to a room temperature or a temperature in a line.

However, an actual gas temperature in the line or in the build-up tank may be different from the room temperature or the temperature in the line. In that case, the calibration of the gas flow rate controller or the calculation of the volume of the processing chamber may not be performed with accuracy. Further, the line is often accommodated in a gas box or the like and, thus, it is difficult to additionally provide a temperature sensor. Accordingly, it is difficult to directly measure a gas temperature in the line.

SUMMARY OF THE INVENTION

In view of the above, the disclosure provides a gas temperature measurement method capable of measuring a gas temperature in a line, and a gas introduction system.

In accordance with an aspect, there is provided a method of measuring a temperature of a gas in a line having one end connected to a gas supply source and the other end connected to a decompressor. The line is divided, by a first, a second and a third valve disposed in that order from the gas supply source, into a first line between the first valve and the second valve and a second line between the second valve and the third valve. The second line has a known inner volume. First, a first pressure rise rate of a gas in the first line is measured in case of introducing a gas at a predetermined flow rate into the first and the second line. Next, a second pressure rise rate of a gas in the first line is measured in case of introducing a gas at a predetermined flow rate only into the first line. Next, a gas temperature in the first line is calculated based on the inner volume of the second line, the first pressure rise rate, and the second pressure rise rate.

In accordance with another aspect, there is provided a gas introducing system including a gas supply source; a depressurizer; a line having one end connected to the gas supply source and the other end connected to the depressurizer; a first, a second and a third valve disposed in the line in that order from the gas supply source; and a control unit. The line is divided, by the first to the third valve, into a first line between the first valve and the second valve and a second line between the second valve and the third valve. The second line has a known inner volume. The control unit measures a first pressure rise rate of a gas in the first line in case of introducing a gas at a predetermined flow rate into the first and the second line, measures a second pressure rise rate of a gas in the first line in case of introducing a gas at a predetermined flow rate only into the first line, and calculates a gas temperature in the first line based on the inner volume of the second line, the first pressure rise rate and the second pressure rise rate.

In the present disclosure, the gas temperature in the first line is calculated based on the inner volume of the second line, the first pressure rise rate in the first and the second line, and the second pressure rise rate in the first line. Therefore, the gas temperature in the first line can be measured without providing the temperature sensor or the like in the first line.

BRIEF DESCRIPTION OF THE DRAWINGS

The objects and features of the disclosure will become apparent from the following description of embodiments, given in conjunction with the accompanying drawings, in which:

FIG. 3 is a graph showing a pressure rise rate in case of performing the gas temperature measurement method of FIG. 2.

DETAILED DESCRIPTION OF THE EMBODIMENTS

Hereinafter, embodiments will be described in detail with reference to the accompanying drawings.

Figure 1:
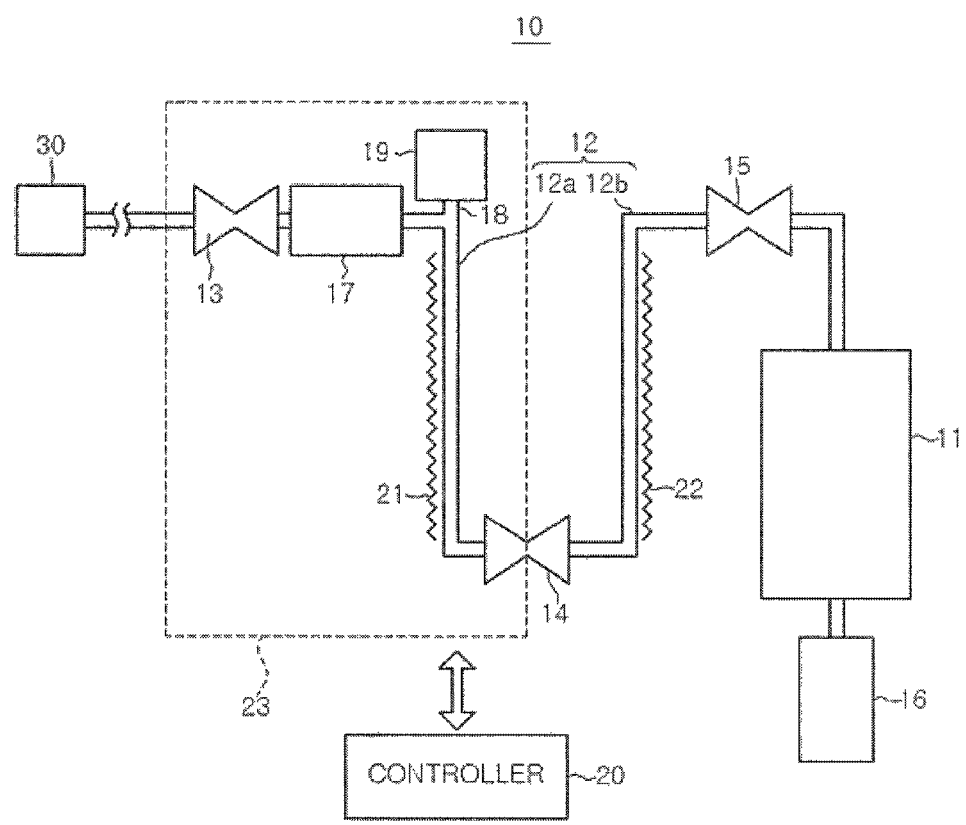
FIG. 1 schematically shows a configuration of a gas introduction system for performing a gas temperature measurement method according to embodiments.

FIG. 1 schematically shows a configuration of a gas introduction system for performing a gas temperature measurement method according to embodiments.

Referring to FIG. 1, a gas introduction system 10 includes: a line 12 having an end connected to a gas supply source 30 and the other end connected to a processing chamber 11; a first to a third valve 13 to 15 disposed in the line 12 in that order from the gas supply source side (from the left side in the drawing); a vacuum pump 16 (decompressor) connected to the line 12 through the processing chamber 11; an FCS 17 (gas flow rate controller) disposed between the first valve 13 and the second valve 14; a pressure gauge 19 connected to a branch line 18 branched from the line 12 between the first valve 13 and the second valve 14; and a controller 20 (control unit) for controlling operations of the respective components of the gas introduction system 10. In the line 12, a portion between the first valve 13 and the second valve 14 forms a first line 12a, and a portion between the second valve 14 and the third valve 15 forms a second line 12b. A heater 21 is installed on the first line 12a, and a heater 22 is installed on the second line 12b. The pressure gauge 19 measures a pressure of a gas in the first line 12a. The first valve 13, the FCS 17, the first line 12a and the pressure gauge 19 are accommodated in a gas box 23. In the gas introduction system 10, a gas from the gas supply source 30 is introduced into the processing chamber 11 at a flow rate controlled by the FCS 17. The vacuum pump 16 decreases a pressure in the processing chamber 11 and pressures in the first line 12a and the second line 12b through the processing chamber 11.

As described above, as for a method of calculating a volume of the processing chamber 11, there is known a method for introducing a gas of a predetermined amount into the line 12 and then into the processing chamber 11, and estimating a volume of the processing chamber 11 based on variation of gas pressures in the line 12 and in the processing chamber 11. In order to estimate the volume of the processing chamber 11, it is required to use a gas temperature in the line 12. However, it is difficult in this method to directly measure a gas temperature in the first line 12a by a temperature sensor because the first line 12a is accommodated in the gas box 23 and it is difficult to install the temperature sensor therein. Therefore, in the present embodiment, the gas temperature in the first line 12a is measured without providing a temperature sensor in the first line 12a.

In the gas introduction system 10, a pressure rise rate $b_1$ in the first line 12a (and the second line 12b) in case of introducing a gas at a flow rate Q (sccm) into the first and the second line 12a and 12b while closing the third valve 15 satisfies the following Eq. (1) based on a gas state equation. In this case, $V_1$ indicates an inner volume of the first line 12a; $V_2$ indicates an inner volume of the second line 12b; $T_u$ indicates a temperature of a gas introduced into the first line 12a or the second line 12b; and $T_k$ indicates a gas temperature in the first line 12a.

Eq. (1)

$$\left(\frac{V_1 + V_2}{T_k}\right)b_1 = \frac{Q}{T_u} \quad (1)$$

Further, in the gas introduction system 10, a pressure rise rate $b_2$ in the first line 12a in case of introducing a gas at a flow rate Q into the first line 12a while closing the second and the third valve 14 and 15 satisfies the following Eq. (2) based on the gas state equation.

Eq. (2)

$$\frac{V_1}{T_k}b_2 = \frac{Q}{T_u} \quad (2)$$

If the Eqs. (1) and (2) are solved to remove the inner volume $V_1$ of the first line 12a, and the flow rate Q is substituted by a flow rate $Q_0$ in the International System of Units which leads to substitution of the gas temperature $T_u$ by an absolute temperature $T_0$, the gas temperature $T_k$ in the first line 12a satisfies the following Eq. (3).

Eq. (3)

$$T_k = -\frac{(b_1 - b_2)Q_0}{b_1 b_2 V_2}T_0 \quad (3)$$

The inner volume $V_1$ of the first line 12a is obtained by the following Eq. (4).

Eq. (4)

$$V_1 = -\frac{b_1}{(b_1 - b_2)}V_2 \quad (4)$$

In the present embodiment, the gas temperature $T_k$ in the first line 12a is calculated by using the above Eq. (3).

Figure 2:
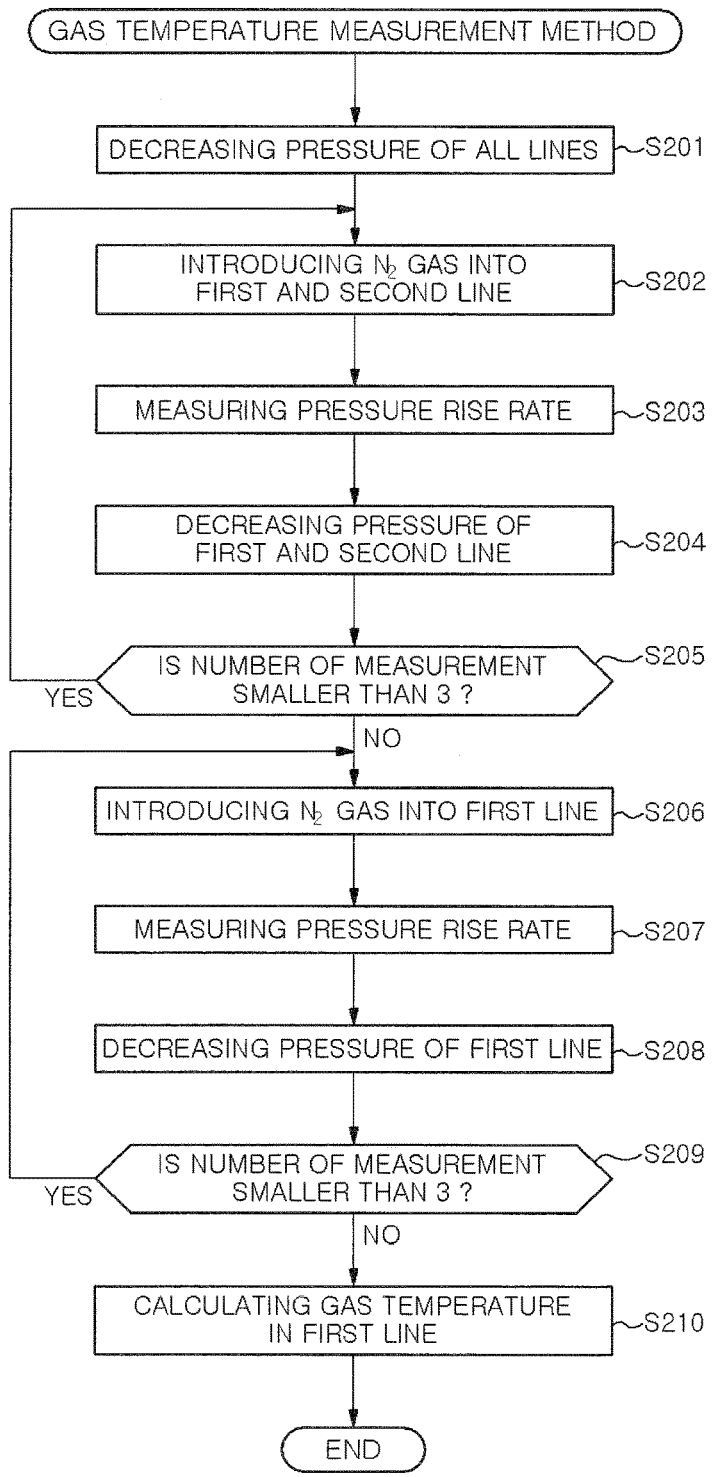
FIG. 2 is a flowchart of the gas temperature measurement method according to the embodiments.

FIG. 2 is a flowchart showing a gas temperature measurement method according to an embodiment. This method is realized by executing a program by a CPU under the control of the controller 20. An inner volume $V_2$ of the second line 12b is measured in advance or known from design drawings or the like.

In FIG. 2, first, the first line 12a and the second line 12b are heated by the heaters 21 and 22 such that the temperature $T_u$ of a gas introduced into the first and the second line 12a and 12b becomes a level, e.g., 100° C., higher than a room temperature by a predetermined value. Next, in a state where the first valve 13 is closed and the second valve 14 and the third valve 15 are opened, pressures in the first and the second line 12a and 12b are decreased by the vacuum pump 16 via the processing chamber 11 (step S201). The pressure in the first and the second line 12a and 12b may be directly decreased through a bypass line that connects the first and the second line 12a and 12b with the vacuum pump 16 or through a bypass line that connects the first and the second line 12a and 12b with another vacuum pump.

Thereafter, the third valve 15 is closed, and the pressure $P_1$ in the first and the second line 12a and 12b are measured by the pressure gauge 19. Then, the first valve 13 is opened and a gas, e.g., $N_2$ gas, from the gas supply source 30 is introduced into the first and the second line 12a and 12b (step S202). A flow rate of $N_2$ gas is controlled to a predetermined level, e.g., 200 sccm.

Next, pressures $P_2$ in the first and the second line 12a and 12b are measured by the pressure gauge 19. A pressure rise rate $b_1$ of a gas in the first line 12a (and the second line 12b) by the introduction of $N_2$ gas is calculated based on time $T_1$ required for the pressure in the first and the second line 12a and 12b to reach the pressure $P_2$ from the pressure $P_1$ and a pressure difference $P_2-P_1$, (S203). Then, in a state where the first valve 13 is closed and the third valve 15 is opened, the pressures in the first and the second line 12a and 12b are decreased via the processing chamber 11 by the vacuum pump 16 (step S204).

Next, it is determined whether or not the number of times of measuring the pressure rise rate b1 of the gas is smaller than three (step S205). When it is smaller than three, the processing returns to the step S202. When it is greater than or equal to three, the second valve 14 is closed and a pressure $P_3$ in the first line 12a is measured by the pressure gauge 19. Thereafter, the first valve 13 is opened and $N_2$ gas is introduced only into the first line 12a from the gas supply source 30 (step S206). At this time, the flow rate of $N_2$ gas is controlled to a predetermined flow rate, e.g., 200 sccm, by the FCS 17. The pressure in the first line 12a may be decreased by the vacuum pump 16 before the introduction of $N_2$ gas.

Then, a pressure $P_4$ in the first line 12a is measured by the pressure gauge 19. A pressure rise rate $b_2$ of the gas in the first line 12a by the introduction of $N_2$ gas is measured based on time $T_2$ required for the pressure in the first line 12a from the pressure $P_3$ to the pressure $P_4$ and a pressure difference $P_4-P_3$ (step S207). Next, in a state where the first valve 13 is closed and the second and the third valve 14 and 15 are opened, the pressure in the first line 12a is decreased via the processing chamber 11 by the vacuum pump 16 (Step S208).

Thereafter, it is determined whether or not the number of times of measuring the pressure rise rate $b_2$ of the gas is smaller than three (step S209). When it is smaller than three, the processing returns to the step S202. When it is greater than or equal to three, a gas temperature $T_k$ in the first line 12a is calculated based on the Eq. (3) using the known inner volume $V_2$ of the second line 12b, the pressure rise rate $b_1$ of the gas measured in the step S203, the pressure rise rate $b_2$ of the gas measured in the step S207, the flow rate $Q_0$ of $N_2$ gas substituted by the flow rate in the International System of Units, and the temperature $T_0$ of $N_2$ gas replaced by the absolute temperature (step S210). This method is terminated.

In the gas temperature measurement method of FIG. 2, the gas temperature $T_k$ in the first line 12a is calculated based on the inner volume $V_2$ of the second line 12b, the pressure rise rate $b_1$ of the gas in the first line 12a in case of introducing $N_2$ gas into the first and the second line 12a and 12b, the pressure rise rate $b_2$ of the gas in the first line 12a in case of introducing $N_2$ gas only into the first line 12a, the flow rate $Q_0$ of $N_2$ gas substituted by the flow rate in the International System of Units, and the gas temperature $T_0$ replaced by the absolute temperature. Accordingly, the gas temperature $T_k$ in the first line 12a can be measured without providing the temperature sensor or the like in the first line 12a.

In the gas temperature measurement method of FIG. 2, the first and the second line 12a and 12b are heated such that the temperature $T_u$ of the gas introduced into the first and the second line 12a and 12b becomes a level, e.g., 100° C., higher than the room temperature by a predetermined value. Accordingly, the gas temperature is hardly affected by an exterior air temperature or the room temperature, which makes it possible to stably measure the gas pressure rise rate $b_1$ or $b_2$. As a result, the gas pressure rise rate $b_1$ or $b_2$ can be measured accurately.

In the gas temperature measurement method of FIG. 2, the pressure in the first or second line 12a or 12b is decreased when the measurement of the gas pressure rise rate $b_1$ is repeated, when the measurement of the gas pressure rise rate $b_2$ is repeated, and before the gas pressure rate $b_2$ is firstly measured after the measuring the gas pressure rise rate $b_1$. Therefore, the gas pressure rise rate $b_1$ or $b_2$ can be measured under the substantially same condition. Accordingly, it is possible to prevent the non-uniformity of the repeatedly measured gas pressure rise rate $b_1$ or $b_2$ from causing deterioration of reliability.

In the gas temperature measurement method of FIG. 2, the first and the second line 12a and 12b are heated by the heaters 21 and 22. Since, however, the temperature of the gas introduced into the first and the second line 12a and 12b is not used in the Eq. (3), the first and the second line 12a and 12b may not be heated by the heaters 21 and 22 in case where a higher throughput is preferred.

While the embodiment of the present disclosure has been described, the present disclosure is not limited to the above-described embodiment.

For example, in the gas temperature measurement method of FIG. 2, the measuring the gas pressure rise rate $b_1$ in case of introducing $N_2$ gas into the first and the second line 12a and 12b is repeated and, then, the measuring the gas pressure rise rate $b_2$ in case of introducing $N_2$ gas only into the first line 12a is repeated. However, it is also possible to repeat the measuring the gas pressure rise rate $b_2$ in case of introducing $N_2$ gas only into the first line 12a and then repeat the measuring the gas pressure rate $b_1$ in case of introducing $N_2$ gas into the first and the second line 12a and 12b.

In the present embodiment, the processing chamber 11 is not particularly specified. A processing chamber of which volume needs to be measured corresponds to the processing chamber 11. For example, a processing chamber of a dry etching apparatus or that of a film forming apparatus corresponds to the processing chamber 11.

The object of the disclosure can also be realized by supplying a storage medium in which a program code of software that realizes the functions of the above-described embodiments is stored to the controller 20 of the gas introduction system 10, and causing a CPU of the controller 20 to read out and execute the program code stored in the storage medium.

In this case, the program code itself read out from the storage medium realizes the functions of the above-described embodiments and, thus, the program code and the storage medium in which the program code is stored constitute the disclosure.

The storage medium for supplying the program code may be, e.g., a RAM, a NVRAM, a floppy (registered trademark) disk, a hard disk, a magneto-optical disk, an optical disk such as CD-ROM, CD-R, CD-RW, DVD (DVD-ROM, DVD-RAM, DVD-RW, DVD+RW), a magnetic tape, a non-volatile memory card, another ROM or the like which may store the program code. Alternatively, the program code may be downloaded from another computer (not shown), database or the like connected to the Internet, a commercial network or a local area network and then supplied to the controller 20.

The functions of the above-described embodiments may be realized not only by executing the program code read out by the controller 20 but also by causing an OS (operating system) or the like which operates in the CPU to perform a part or all of actual operations based on instructions of the program code.

The functions of the above-described embodiments may also be realized by storing the program code read out from the storage medium in a memory provided for a functional extension board inserted into the controller 20 or a function extension unit connected to the controller 20 and then causing the CPU provided for the functional extension board or the function extension unit to perform a part or all of the actual operations based on the instructions of the program code.

The program code may be an object code, a program code executed by an interpreter, script data supplied to the OS, or the like.

TEST EXAMPLE

Hereinafter, a test example of the present disclosure will be described.

In this case, the gas temperature measurement method of FIG. 2 was performed in a state where a flow rate of nitrogen gas introduced from the gas supply source 30 was controlled to 200 sccm by the FCS 17.

FIG. 3 is a graph showing a pressure rise rate in case of performing the gas temperature measurement method of FIG. 2. In the steps 3203 and S207, when the pressure in the first line 12a reaches about 60 Torr, the introduction of $N_2$ gas was stopped. Then, the steps S204 and S208 were performed.

In FIG. 3, the pressure rise rate $b_1$ of the gas in the first line 12a in case of introducing $N_2$ gas into the first and the second line 12a and 12b was 15.447 Torr/sec, 15.436 Torr/sec, and 15.448 Torr/sec. The pressure rise rate $b_2$ of the gas in the first line 12a in case of introducing $N_2$ gas only into the first line 12a was 30.533 Torr/sec, 30.546 Torr/sec, and 30.534 Torr/sec. In the present embodiment, the variation of the pressure rise rates $b_1$ and $b_2$ was small and, thus, the initial measurement results were used. The inner volume $V_2$ of the second line 12b was calculated to be 0.10511 L from the design drawings. The flow rate Q of 200 sccm was substituted by the flow rate $Q_0$ of 2.54093 Torr·L/sec in the International System of Units. Therefore, the gas temperature $T_k$ in the first line 12a was calculated to be 80.1° C. based on the Eq. (3). The inner volume $V_1$ of the first line 12a was calculated to be 0.10863 L based on the Eq. (4). In order to check the accuracy of the calculation result, the inverse operation of the flow rate Q was performed based on the following Eq. (5) using the gas temperature $T_k$ (80.1° C.) in the first line 12a and a sum (0.21374 L) of the inner volume $V_1$ of the first line 12a and the inner volume $V_2$ of the second line 12b. As a result, the flow rate Q of 200.6 sccm which is substantially the same as the flow rate Q (200 sccm) controlled by the FCS 17 was obtained.

$$Q=(V_1+V_2)b_1 \quad \text{Eq. (5)}$$

From the above, it is clear that the temperature $T_k$ of the gas in the first line 12a which is calculated by the gas temperature measurement method of FIG. 2 is almost accurate.

While the disclosure has been shown and described with respect to the embodiments, it will be understood by those skilled in the art that various changes and modifications may be made without departing from the scope of the disclosure as defined in the following claims.

What is claimed is:

1. A method of measuring a temperature of a gas in a line having one end connected to a gas supply source and the other end connected to a decompressor, the line being divided, by a first valve, a second valve, and a third valve disposed in that order from the gas supply source, into a first line between the first valve and the second valve and a second line between the second valve and the third valve, the second line having a known inner volume, the method comprising:
    measuring a first pressure rise rate of the gas in the first line in case of introducing the gas at a predetermined flow rate into the first and the second lines;
    measuring a second pressure rise rate of the gas in the first line in case of introducing the gas at the predetermined flow rate only into the first line; and
    calculating a gas temperature in the first line based on the inner volume of the second line, the first pressure rise rate, and the second pressure rise rate.

2. The method of claim 1, wherein the gas temperature in the first line is calculated based on a following equation:

$$T_k = -\frac{(b_1-b_2)Q_0}{b_1 b_2 V_2} T_0$$

where $T_k$ indicates a gas temperature in the first line; $b_1$ indicates the first pressure rise rate; $b_2$ indicates the second pressure rise rate; $V_2$ indicates the inner volume of the second line; $Q_0$ indicates the predetermined flow rate of the gas (International System of Unit); and $T_0$ indicates an absolute temperature of the gas.

3. The method of claim 1, further comprising:
    heating the gas such that a difference between a room temperature and the gas temperature is set to be greater than or equal to a predetermined value before measuring the first and the second pressure rise rates.

4. The method of claim 1, further comprising:
    depressurizing the first and the second lines between the step of measuring the first pressure rise rate and the step of measuring the second pressure rise rate.

5. The method of claim 1, wherein the steps of measuring the first pressure rise rate and measuring the second pressure rise rate are repeated multiple times.

6. A gas introducing system comprising:
    a gas supply source;
    a depressurizer;
    a line having one end connected to the gas supply source and the other end connected to the depressurizer;
    a first valve, a second valve, and a third valve disposed in the line in that order from the gas supply source; and
    a control unit,
    wherein the line is divided, by the first to third valves, into a first line between the first valve and the second valve and a second line between the second valve and the third valve;
    the second line has a known inner volume; and
    the control unit measures a first pressure rise rate of a gas in the first line in case of introducing the gas at a predetermined flow rate into the first and the second lines, measures a second pressure rise rate of the gas in the first line in case of introducing the gas at the predetermined flow rate only into the first line, and calculates a gas temperature in the first line based on the inner volume of the second line, the first pressure rise rate and the second pressure rise rate.

* * * * *